(12) United States Patent
Hopwood et al.

(10) Patent No.: US 10,757,781 B2
(45) Date of Patent: Aug. 25, 2020

(54) LIGHTING APPARATUS INCLUDING LIGHT-EMITTING DIODES

(71) Applicant: Seoul Semiconductor Co., Ltd., Ansan-si (KR)

(72) Inventors: Keith Hopwood, Ansan-si (KR); Hyung Jin Lee, Ansan-si (KR); Sung Ho Jin, Ansan-si (KR); Sang Wook Han, Ansan-si (KR); In Seok Baek, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/368,875

(22) Filed: Mar. 29, 2019

(65) Prior Publication Data

US 2019/0306942 A1 Oct. 3, 2019

(30) Foreign Application Priority Data

Mar. 30, 2018 (KR) .................. 10-2018-0037269

(51) Int. Cl.
*H05B 45/37* (2020.01)
*H03K 5/24* (2006.01)
(Continued)

(52) U.S. Cl.
CPC .............. *H05B 45/37* (2020.01); *H03K 5/24* (2013.01); *H05B 45/14* (2020.01); *H05B 45/20* (2020.01); *H05B 45/24* (2020.01); *H05B 45/44* (2020.01)

(58) Field of Classification Search
None
See application file for complete search history.

(56) References Cited

U.S. PATENT DOCUMENTS

2009/0302779 A1* 12/2009 McKinney ............. H05B 45/37
315/294
2012/0001558 A1* 1/2012 Vos ........................ H05B 45/37
315/193

(Continued)

FOREIGN PATENT DOCUMENTS

CN 106658871 5/2017
CN 206875378 1/2018
(Continued)

OTHER PUBLICATIONS

European Extended Search Report dated Jun. 28, 2019, issued in European Application No. EP19165826.9.
(Continued)

*Primary Examiner* — Crystal L Hammond
(74) *Attorney, Agent, or Firm* — H.C. Park & Associates, PLC

(57) ABSTRACT

A lighting apparatus including an LED circuit including a plurality of serially connected stages configured to receive a modulated rectified voltage, each of the stages including a first path including a first resistor and a first LED connected in series, and a second path connected to the first path in parallel and including a second LED configured to emit light having a color temperature different from that emitted from the first LED, and a driving current controller configured to adjust an intensity of light output from the LED circuit by adjusting currents applied to driving nodes connected to the stages, depending on a dimming signal associated with a dimming level of the rectified voltage, in which a threshold voltage of the first LED is lower than that of the second LED.

20 Claims, 10 Drawing Sheets

(51) Int. Cl.
    *H05B 45/14*     (2020.01)
    *H05B 45/20*     (2020.01)
    *H05B 45/24*     (2020.01)
    *H05B 45/44*     (2020.01)

(56) References Cited

U.S. PATENT DOCUMENTS

| | | | |
|---|---|---|---|
| 2014/0300274 A1* | 10/2014 | Acatrinei | H05B 45/46 |
| | | | 315/85 |
| 2015/0334801 A1* | 11/2015 | Wu | H05B 45/37 |
| | | | 315/186 |
| 2016/0081145 A1* | 3/2016 | Peeters | A01G 9/20 |
| | | | 315/185 R |
| 2018/0116021 A1* | 4/2018 | Jin | H05B 33/083 |
| 2019/0132925 A1* | 5/2019 | Wang | H05B 33/0821 |

FOREIGN PATENT DOCUMENTS

| | | | |
|---|---|---|---|
| WO | 2012/044223 | 4/2012 | |
| WO | WO-2012044223 A1 * | 4/2012 | H05B 33/0809 |
| WO | 2018/117720 | 6/2018 | |

OTHER PUBLICATIONS

European Office Action dated Mar. 30, 2020, in the European Patent Application No. 19165826.9.

* cited by examiner

LIGHTING APPARATUS INCLUDING LIGHT-EMITTING DIODES

CROSS REFERENCE TO RELATED APPLICATION

This application claims priority from and the benefit of Korean Patent Application No. 10-2018-0037269, filed on Mar. 30, 2018, which is hereby incorporated by reference for all purposes as if fully set forth herein.

BACKGROUND

Field

Exemplary embodiments of the invention relate generally to a lighting apparatus and, more specifically, to a lighting apparatus including light-emitting diodes.

Discussion of the Background

A lighting apparatus including light-emitting diodes (LEDs) may convert an AC voltage into a rectified voltage and cause the LEDs to emit light depending on the level of the rectified voltage.

A conventional incandescent bulb may support a dimming function to adjust a brightness of light according to a user's choice. In the incandescent bulb, change in the brightness of output light may cause change in a color temperature. For example, when darkening the incandescent bulb, the temperature of a filament emitting light in the bulb is decreased, thereby decreasing the color temperature of light emitted from the filament.

Recent lighting apparatus including LEDs may provide a predetermined light output and may also support a dimming function capable of outputting light at various levels according to a user's choice. Furthermore, demands for a lighting apparatus including LEDs that is capable of providing a feel similar to that of an incandescent bulb are increasing, such as a change in a color temperature when the brightness of an output light is changed.

The above information disclosed in this Background section is only for understanding of the background of the inventive concepts, and, therefore, it may contain information that does not constitute prior art.

SUMMARY

Exemplary embodiments of the invention provide a lighting apparatus including LEDs capable of controlling the color temperature of an output light.

Additional features of the inventive concepts will be set forth in the description which follows, and in part will be apparent from the description, or may be learned by practice of the inventive concepts.

A lighting apparatus according to an exemplary embodiment includes an LED circuit including a plurality of serially connected stages configured to receive a modulated rectified voltage, each of the stages including a first path including a first resistor and a first LED connected in series, and a second path connected to the first path in parallel and including a second LED configured to emit light having a color temperature different from that emitted from the first LED, and a driving current controller configured to adjust an intensity of light output from the LED circuit by adjusting currents applied to driving nodes connected to the stages, depending on a dimming signal associated with a dimming level of the rectified voltage, in which a threshold voltage of the first LED is lower than that of the second LED.

The first LED may include first light-emitting cells and a first wavelength conversion layer covering the first light-emitting cells, and the second LED may include second light-emitting cells and a second wavelength conversion layer different from the first wavelength conversion layer.

The first light-emitting cells may be connected with each other in series, the second light-emitting cells may be connected with each other in series, and the number of the first light-emitting cells may be less than the number of the second light-emitting cells.

The first LED may be configured to emit light having a first color temperature, and the second LED may be configured to emit light having a second color temperature lower than the first color temperature.

The stages may include a first stage and a second stage sequentially connected to each other, the driving nodes may include a first driving node, the first stage may be connected between an input node configured to receive the rectified voltage and a branch node, and the second stage may be connected between the branch node and the first driving node, and the driving current controller may be configured to control a current of the first driving node depending on the dimming signal.

The driving nodes may further include a second driving node, the LED circuit may further include a capacitor connected between the branch node and the second driving node, and the driving current controller may be configured to control a current of the second driving node depending on the dimming signal.

The stages may include sequentially connected first, second, third, and fourth stages, and the driving nodes include first, second, third, and fourth driving nodes, the first stage may be connected between an input node configured to receive the rectified voltage and the first driving node, the second stage may be connected between the first and second driving nodes, the third stage may be connected between the second and third driving nodes, and the fourth stage may be connected between the third and fourth driving nodes, and the driving current controller may be configured to control currents of the first, second, third, and fourth driving nodes depending on the dimming signal.

The lighting apparatus may further include an LED driver connected to the LED circuit and the driving current controller through the driving nodes and a current setting node, respectively, in which the LED driver may be configured to adjust currents of the driving nodes depending on a voltage of the current setting node, and the driving current controller may be configured to control the voltage of the current setting node depending on the dimming signal.

The lighting apparatus may further include a dimmer configured to generate the dimming signal.

The dimmer may include at least one of a triac dimmer and a pulse-width dimmer.

A lighting apparatus according to another exemplary embodiment includes an LED circuit including a plurality of serially connected stages configured to receive a modulated rectified voltage, each of the stages including a first path including a first resistor and a first LED connected in series, and a second path connected to the first path in parallel and including a second LED configured to emit light having a color temperature different from that emitted from the first LED, and a driving current controller configured to adjust an intensity of light output from the LED circuit in accordance with a dimming signal by adjusting currents applied to the stages, in which the second LED has a greater number of light emitting cells than the first LED.

The color temperature of light emitted from the first LED may be lower than that of light emitted from the second LED.

The threshold voltage of the light emitting cells of the first and second LEDs may be the same as each other.

The light emitting cells of each of the first and second LEDs may be serially connected to one another and are covered by a wavelength conversion layer.

The lighting apparatus may further include an LED driver connected between the LED circuit and the driving current controller, the LED driver including comparators connected to the stages, respectively.

The LED circuit may further include a capacitor connected to an output terminal of one of the stages and one of the comparators, the capacitor being configured to be charged and discharged in accordance to a level of the rectified voltage, and provide current to the stages while being discharged.

The comparators may be connected in common to the driving current controller.

The lighting apparatus may further include a driving current control circuit connected to the driving current controller and configured to provide a DC voltage control signal to the driving current controller.

A threshold voltage of the first LED may be lower than that of the second LED.

The lighting apparatus may further include a triac dimmer configured to generate the dimming signal.

It is to be understood that both the foregoing general description and the following detailed description are exemplary and explanatory and are intended to provide further explanation of the invention as claimed.

DETAILED DESCRIPTION

Figure 1:
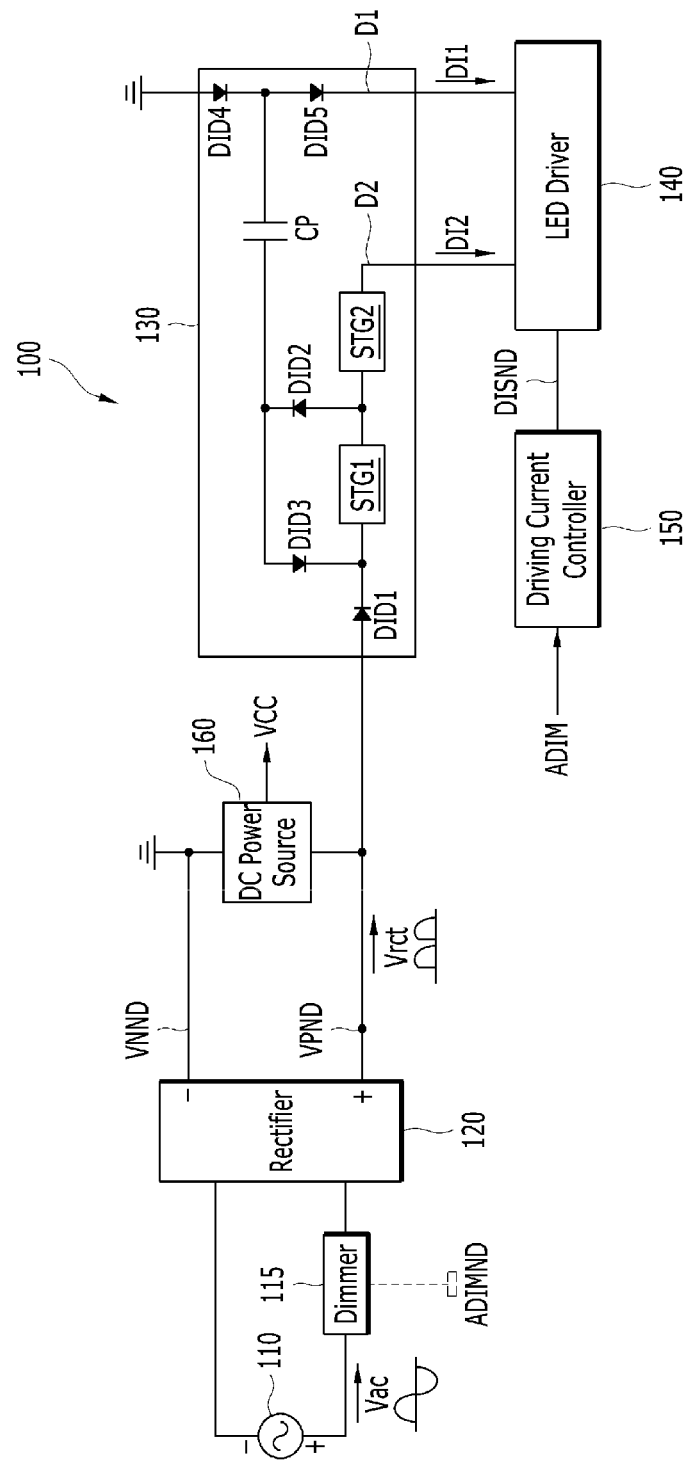
FIG. 1 is a block diagram of a lighting apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of a lighting apparatus 100 according to an exemplary embodiment.

Referring to FIG. 1, the lighting apparatus 100 may be connected to an AC power source 110 and receive an AC voltage Vac, and may include a dimmer 115, a rectifier 120, an LED circuit 130, an LED driver 140, a driving current controller 150, and a DC power source 160.

The dimmer 115 may receive the AC voltage Vac from the AC power source 110, modulate the AC voltage Vac to have a dimming level according to a user's selection, and output the modulated AC voltage. The dimmer 115 may include a triac dimmer, which may cut the phase of the AC voltage Vac based on a triac, a pulse-width dimmer, which may modulate the pulse-width of the AC voltage Vac, or etc. However, the inventive concepts are not limited to a particular type of the dimmer.

When the dimmer 115 is a triac dimmer according to an exemplary embodiment, the dimmer 115 may output a modulated AC voltage by cutting the phase of the AC voltage Vac based on a dimming level selected by a user. In this case, control over a triac trigger current may be required. As such, the lighting apparatus 100 may further include a bleeder circuit connected between the dimmer 115 and the rectifier 120. For example, the bleeder circuit may include a capacitor and a resistor.

In FIG. 1, the dimmer 115 is shown as a component of the lighting apparatus 100. However, the inventive concepts are not limited thereto. For example, the dimmer 115 may be disposed outside the lighting apparatus 100 and be electrically connected with the lighting apparatus 100 in some exemplary embodiments.

The rectifier 120 may rectify the AC voltage modulated by the dimmer 115 and output a rectified voltage Vrct through a first power node VPND and a second power node VNND. The second power node VNND may be a ground node. The rectified voltage Vrct is output to the LED circuit 130 and the DC power source 160.

The lighting apparatus 100 may further include a surge protection circuit to protect internal components of the lighting apparatus 100 from an overvoltage and/or an overcurrent. The surge protection circuit may be connected, for example, between the first and second power nodes VPND and VNND.

The LED circuit 130 is connected between the first and second power nodes VPND and VNND, and operates in response to the rectified voltage Vrct. The LED circuit 130 includes a plurality of stages STG1 and STG2, which include LEDs each emitting light. Each of the stages STG1 and STG2 may selectively emit light depending on the level of the rectified voltage Vrct. The stages STG1 and STG2 are connected to the LED driver 140 through first and second driving nodes D1 and D2. The current of the first and second driving nodes D1 and D2 may be adjusted by the LED driver 140. The brightness of light emitted from each of the LEDs included in the stages STG1 and STG2 may be changed depending on the current. When the current of the first and second driving nodes D1 and D2 are adjusted, the brightness of light emitted from each of the LEDs may be changed.

As shown in FIG. 1, the LED circuit 130 may include first and second stages STG1 and STG2. The first and second stages STG1 and STG2 may be sequentially connected between the first power node VPND and the second driving node D2, and the output terminal of the first stage STG1 may be connected to the first driving node D1. However, the inventive concepts are not limited thereto, and in some exemplary embodiments, the number of the stages STG1 and STG2, the connection relationship between the stages STG1 and STG2, and the connection relationship between the stages STG1 and STG2 and the LED driver 140 may be variously modified.

The LED circuit 130 may further include a capacitor CP. The capacitor CP may be connected between the output terminal of the first stage STG1 and the first driving node D1. The capacitor CP may be charged and discharged depending on the level of the rectified voltage Vrct, and may provide current to the first and second stages STG1 and STG2 when being discharged. In this manner, the first and second stages STG1 and STG2 may emit light even when the level of the rectified voltage Vrct becomes lower than corresponding threshold voltages, due to the capacitor CP.

The LED circuit 130 may further include first to fifth diodes DID1 to DID5 for preventing reverse current. The first diode DID1 is connected between the first power node VPND and the first stage STG1, and blocks current flowing from the first stage STG1 to the first power node VPND. The second diode DID2 is connected between the output terminal of the first stage STG1 and the capacitor CP, and blocks current flowing from the capacitor CP to the output terminal of the first stage STG1. The third diode DID3 is connected between the capacitor CP and the input terminal of the first stage STG1, and blocks current flowing from the input terminal of the first stage STG1 to the capacitor CP. The fourth and fifth diodes DID4 and DID5 are connected between the ground node (or the second power node VNND) and the first driving node D1, and a branch node between the fourth and fifth diodes DID4 and DID5 is connected to the capacitor CP. The fourth diode DID4 blocks current flowing from the branch node to the ground node, and the fifth diode DID5 blocks current flowing from the first driving node D1 to the branch node.

The LED driver 140 is connected to the LED circuit 130 through the first and second driving nodes D1 and D2. The LED driver 140 provides first and second driving currents DI1 and DI2 to the LED circuit 130 through the first and second driving nodes D1 and D2. As the level of driving current is high, the brightness of light output from a corresponding stage through which the driving current flows may be increased.

The driving current controller 150 controls the LED driver 140 to adjust the first and second driving currents DI1 and DI2 depending on a dimming signal ADIM indicating a dimming level. The dimming signal ADIM may indicate the modulation degree of the rectified voltage Vrct.

The driving current controller 150 is connected to the LED driver 140 through a current setting node DISND. The driving current controller 150 may control the voltage of the current setting node DISND depending on the dimming signal ADIM. The LED driver 140 may adjust the levels of the first and second driving currents DI1 and DI2 depending on the voltage of the current setting node DISND. When the voltage of the current setting node DISND increases, the LED driver 140 may increase the levels of the first and second driving currents DI1 and DI2. When the voltage of the current setting node DISND decreases, the LED driver 140 may decrease the levels of the first and second driving currents DI1 and DI2.

In some exemplary embodiments, the dimming signal ADIM may be provided through a dimming node ADIMND from the dimmer 115. In other exemplary embodiments, the lighting apparatus 100 may further include a dimming level detector to generate the dimming signal ADIM based on the rectified voltage Vrct. The types of dimming signals may be variously modified. For example, the dimming level detector may include an RC integrator circuit and output a DC voltage that is based on the rectified voltage Vrct as the dimming signal ADIM. As another example, the dimming level detector may detect the pulse-width of each period of the rectified voltage Vrct, and may output an analog signal or a digital signal corresponding to a detected pulse-width as the dimming signal ADIM.

Figure 2:
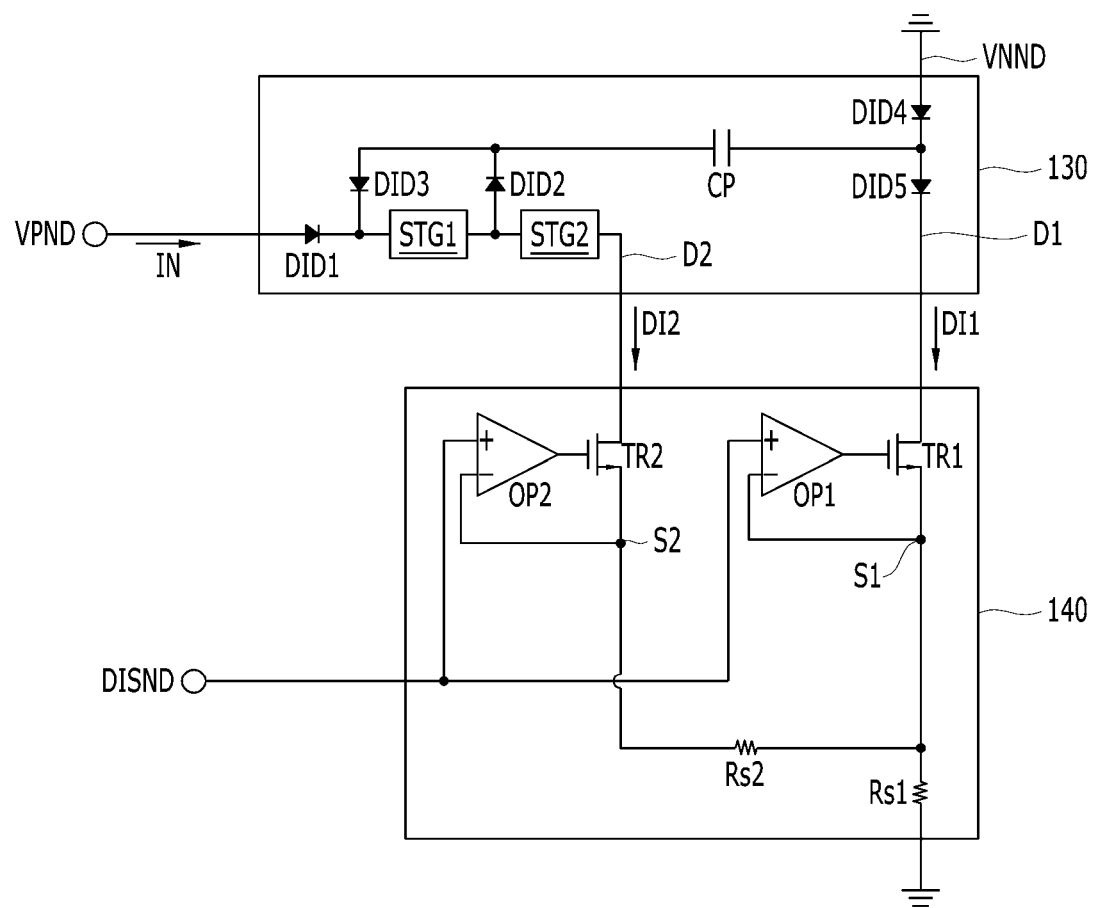
FIG. 2 is an exemplary circuit diagram of the LED circuit and the LED driver of FIG. 1.

FIG. 2 is an exemplary circuit diagram of the LED circuit 130 and the LED driver 140 of FIG. 1.

Referring to FIG. 2, the LED driver 140 may include a first transistor TR1, a first comparator OP1, a second transistor TR2, a second comparator OP2, and one or more source resistors Rs1 and Rs2.

The first transistor TR1 and the first comparator OP1 control the current of the first driving node D1, and the second transistor TR2 and the second comparator OP2 control the current of the second driving node D2. The first transistor TR1 is connected between the first driving node D1 and a first source node S1. The first comparator OP1 has an output terminal connected to the gate of the first transistor TR1 and an inverting terminal connected to the first source node S1. The second transistor TR2 is connected between the second driving node D2 and a second source node S2. The second comparator OP2 has an output terminal connected to the gate of the second transistor TR2 and an inverting terminal connected to the second source node S2. The non-inverting terminals of the first and second comparators OP1 and OP2 are connected in common to the current setting node DISND. The first and second transistors TR1 and TR2 may be NMOS transistors, for example.

When the voltage of the first source node S1 is lower than the voltage of the current setting node DISND, the first transistor TR1 may be turned on by the output of the first comparator OP1. When the voltage of the first source node S1 becomes higher than the voltage of the current setting node DISND by the rectified voltage Vrct (see FIG. 1) provided through the first power node VPND, the first transistor TR1 may be turned off by the output of the first comparator OP1. In this manner, the first transistor TR1 may be repeatedly turned on and off. As such, the voltage of the current setting node DISND may be reflected on the voltage of the first source node S1. Similarly, the voltage of the current setting node DISND may be reflected on the voltage of the second source node S2.

The first source resistor Rs1 is connected between the first source node S1 and the ground node. Depending on the voltage of the first source node S1 and the resistance of the first source resistor Rs1, the level of the first driving current DI1 may be determined. The second source resistor Rs2 is connected between the second source node S2 and the first source node S1. Depending on the voltage of the second source node S2 and the sum of resistance of the first and second source resistors Rs1 and Rs2, the level of the second driving current DI2 may be determined. For example, the level of the second driving current DI2 may be lower than the level of the first driving current DI1.

As such, the levels of the first and second driving currents DI1 and DI2 may be respectively controlled depending on the voltage of the current setting node DISND.

Figure 3:
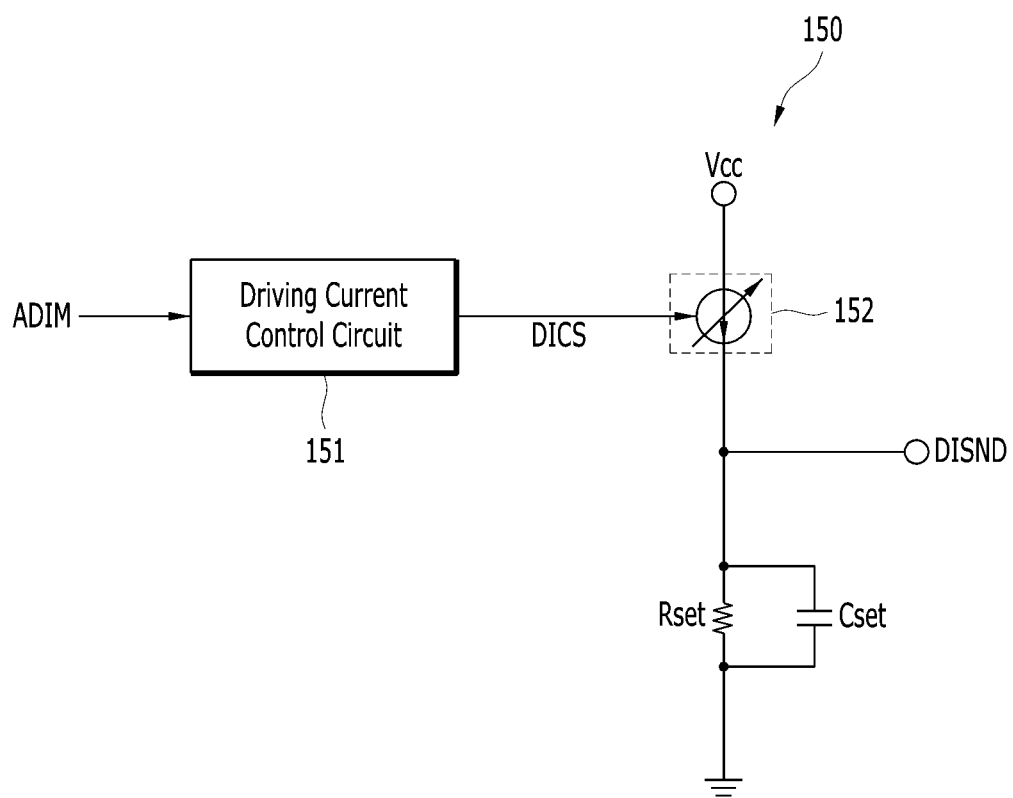
FIG. 3 is an exemplary block diagram of the driving current controller of FIG. 1.

FIG. 3 is an exemplary block diagram of the driving current controller 150 of FIG. 1.

Referring to FIG. 3, the driving current controller 150 may include a driving current control circuit 151, a voltage regulator 152, and a setting resistor Rset.

The driving current control circuit 151 may output a driving current control signal DICS depending on the dimming signal ADIM. In some exemplary embodiments, the driving current control signal DICS may be provided as a DC voltage. The driving current control circuit 151 may increase the voltage of the driving current control signal DICS as a dimming level when the dimming signal ADIM is high.

The setting resistor Rset is connected between the current setting node DISND and the ground node. In some exemplary embodiments, a setting capacitor Cset may be connected to the setting resistor Rset in parallel to eliminate or reduce noise in the voltage of the current setting node DISND.

The voltage regulator 152 regulates the voltage of the current setting node DISND depending on the driving current control signal DICS. For example, the voltage regulator 152 may include a variable current source, which generates high current as the voltage of the driving current control signal DICS increases. As high current flows, the voltage of the current setting node DISND may be increased.

Figure 4:
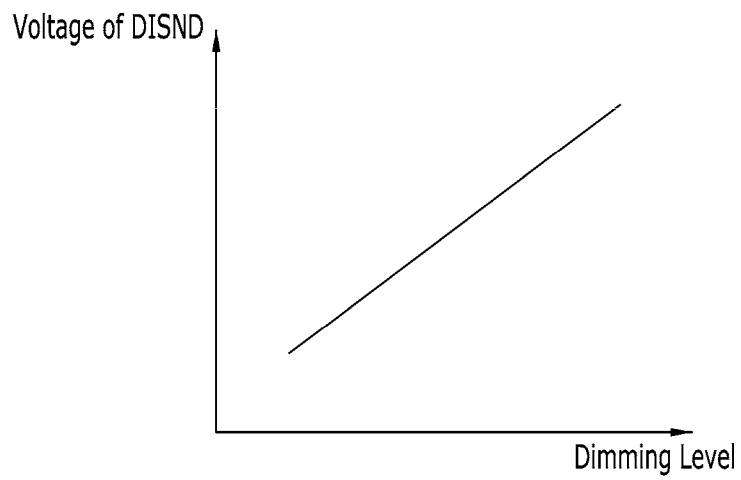
FIG. 4 is a graph for illustrating the voltage of a current setting node biased depending on a dimming level.
Figure 5:
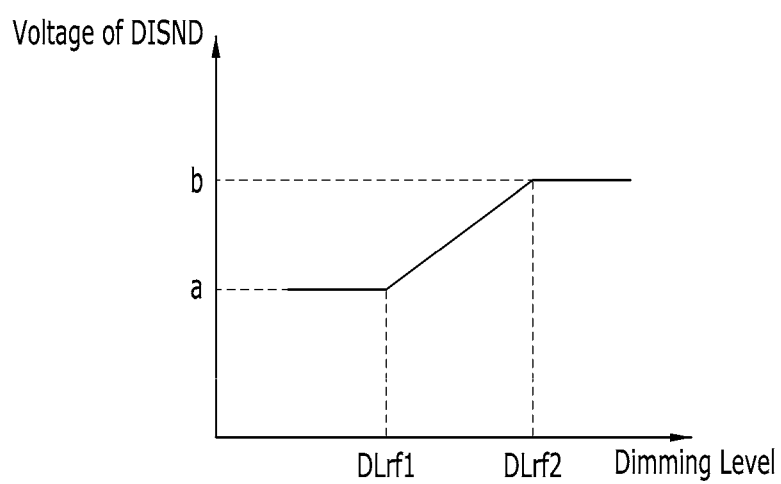
FIG. 5 is a graph for illustrating the voltage of a current setting node biased depending on a dimming level.

FIG. 4 is a graph illustrating the voltage of the current setting node DISND biased depending on a dimming level. FIG. 5 is a graph illustrating the voltage of the current setting node DISND biased depending on a dimming level.

Referring to FIG. 4, the driving current controller 150 may increase the voltage of the current setting node DISND as a dimming level increases. Referring to FIG. 5, the driving current controller 150 may maintain the voltage of the current setting node DISND to a first voltage level "a" when a dimming level is lower than a first reference dimming level DLrf1, may maintain the voltage of the current setting node DISND to a second voltage level "b" higher than the first voltage level "a" when a dimming level is higher than a second reference dimming level DLrf2, and may increase the voltage of the current setting node DISND depending on a dimming level between the first and second voltage levels "a" and "b" when a dimming level is between the first and second reference dimming levels DLrf1 and DLrf2.

Figure 6:
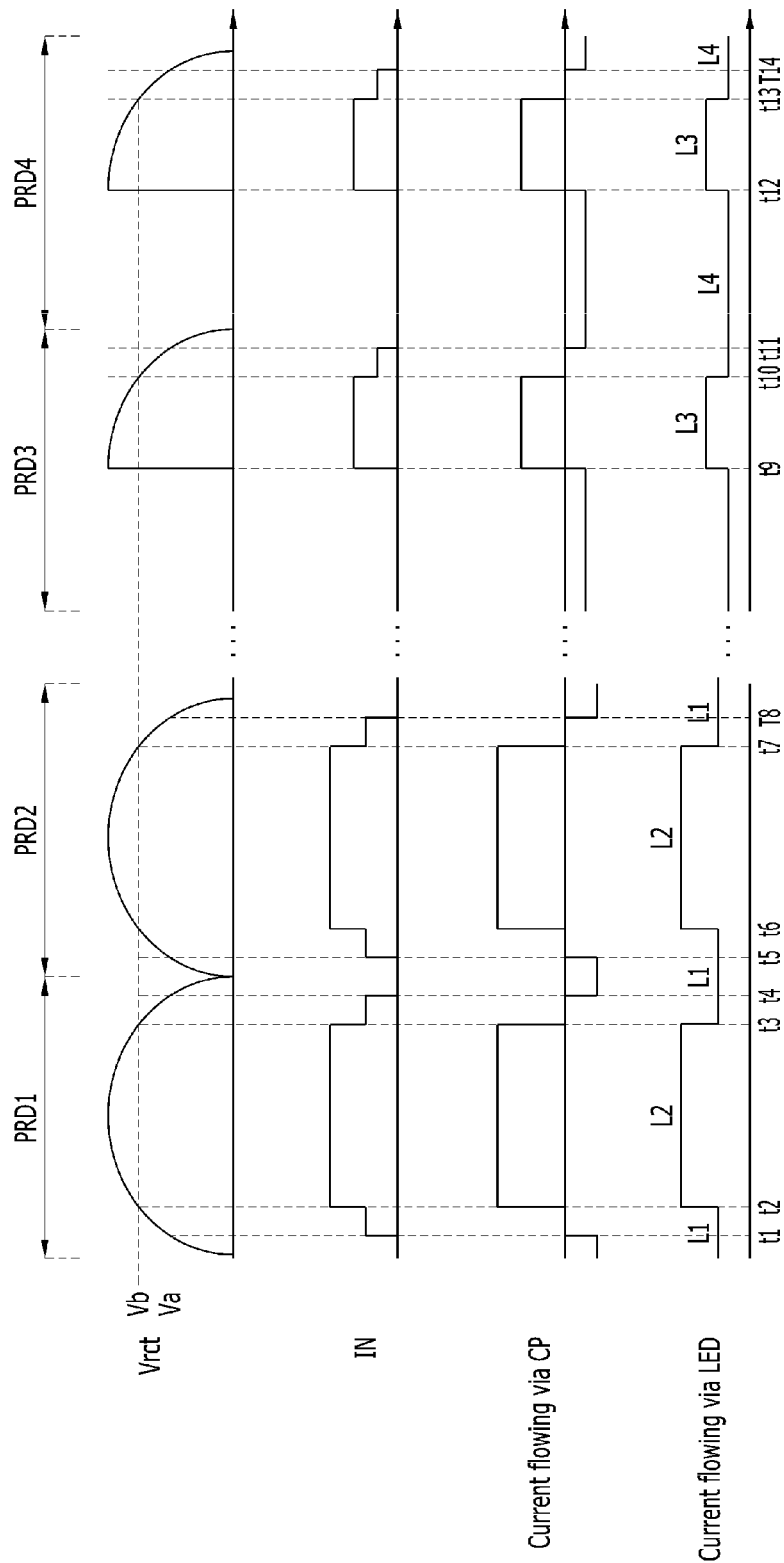
FIG. 6 is a timing diagram for illustrating a method for driving a plurality of stages according to an exemplary embodiment.

FIG. 6 is a timing diagram illustrating a method for driving the plurality of stages STG1 and STG2 according to an exemplary embodiment.

Referring to FIGS. 2 and 6, the rectified voltage Vrct is received during first to fourth periods PRD1 to PRD4. As the rectified voltage Vrct increases, at a first time t1, it reaches a first voltage Va. The first voltage Va may be the sum of the threshold voltages of the first and second stages STG1 and STG2, which are coupled in series. As such, input current IN may flow through the first and second stages STG1 and STG2 and the second driving node D2. Accordingly, the first and second stages STG1 and STG2 may emit light. The second driving current DI2 of the second driving node D2 may be adjusted to have a first level L1.

As the rectified voltage Vrct increases, at a second time t2, it becomes higher than a second voltage Vb. The second voltage Vb may be the sum of the threshold voltage of the first stage STG1 and the voltage across the capacitor CP. The input current IN may flow through the first stage STG1, the capacitor CP, and the first driving node D1. Accordingly, the first stage STG1 may emit light. Since the sum of the resistances of the resistors Rs1 and Rs2, which are connected to the second driving node D2 through the second transistor TR2, is higher than the resistance of the resistor Rs1 connected to the first driving node D1 through the first transistor TR1, the second driving current DI2 may be gradually blocked. The first driving current DI1 of the first driving node D1 may have a second level L2 higher than the first level L1.

As the rectified voltage Vrct decreases, at a third time t3, it becomes lower than the second voltage Vb. The input current IN flowing through the first stage STG1, the capacitor CP, and the first driving node D1 is blocked, and may flow through the first and second stages STG1 and STG2 and the second driving node D2. The second driving current DI2 may be controlled to have the first level L1.

As the rectified voltage Vrct further decreases, at a fourth time t4, it becomes lower than the first voltage Va. The input current IN flowing through the first and second stages STG1 and STG2 and the second driving node D2 is blocked. The voltage across the capacitor CP, which is charged, may be higher than the first voltage Va. The charges in the capacitor CP may flow through the first and second stages STG1 and STG2 and the second driving node D2. In this manner, the LED circuit 130 may emit light even in a time period when the rectified voltage Vrct becomes lower than the first voltage Va. The second driving current DI2 may be controlled to have the first level L1.

At fifth to eighth times t5 to t8, the LED circuit 130 is driven in a manner similar to the first to fourth times t1 to t4. As such, repeated descriptions of the substantially similar operations during the fifth to eighth times t5 to t8 will be omitted to avoid redundancy.

The rectified voltage Vrct may be modulated. For example, as the rectified voltage Vrct of the third period PRD3 is phase-cut, a voltage of approximately 0V may be received during a certain time of the third period PRD3, and a voltage higher than 0V may be received during the remaining time. More particularly, a dimming level corresponding to the rectified voltage Vrct of the third period PRD3 is lower than a dimming level corresponding to the rectified voltage Vrct of the first period PRD1 and the second period PRD2.

At a ninth time t9, the rectified voltage Vrct of the third period PRD3 becomes higher than the second voltage Vb. The input current IN may flow through the first stage STG1, the capacitor CP, and the first driving node D1. Accordingly, the first stage STG1 may emit light. Before the ninth time t9, the charges in the capacitor CP may flow through the first and second stages STG1 and STG2 and the second driving node D2. Since the sum of the resistances of the resistors Rs1 and Rs2 connected to the second driving node D2 is higher than the resistance of the resistor Rs1 connected to the first driving node D1, the second driving current DI2 may be blocked at the ninth time t9.

The first driving current DI1 of the first driving node D1 is adjusted to have a third level L3 lower than the second level L2. As described above with reference to FIG. 1, the driving current controller 150 adjusts the first and second driving currents DI1 and DI2 depending on the dimming signal ADIM that corresponds to a dimming level. Since the dimming level of the rectified voltage Vrct of the third period PRD3 is lower than the dimming level of the rectified voltage Vrct of the first period PRD1 and the second period PRD2, the first driving current DI1 has the third level L3 lower than the second level L2.

As the rectified voltage Vrct of the third period PRD3 decreases, at a tenth time t10, it becomes lower than the second voltage Vb. The input current IN flowing through the first stage STG1, the capacitor CP, and the first driving node D1 is blocked, and may flow through the first and second stages STG1 and STG2 and the second driving node D2. Accordingly, the first and second stages STG1 and STG2 may emit light. Since the dimming level of the rectified voltage Vrct of the third period PRD3 is lower than the dimming level of the rectified voltage Vrct of the first period PRD1 and the second period PRD2, the second driving current DI2 of the second driving node D2 is adjusted to have a fourth level L4 lower than the first level L1.

As the rectified voltage Vrct of the third period PRD3 further decreases, at an eleventh time t11, it becomes lower than the first voltage Va. The input current IN flowing through the first and second stages STG1 and STG2 and the second driving node D2 is blocked. The charges in the capacitor CP may flow through the first and second stages STG1 and STG2 and the second driving node D2. The second driving current DI2 is controlled to have the fourth level L4.

At twelfth to fourteenth times t12 to t14, the LED circuit 130 is driven in a manner similar to the ninth to eleventh times t9 to t11, and thus, repeated descriptions thereof will be omitted to avoid redundancy.

Figure 7:
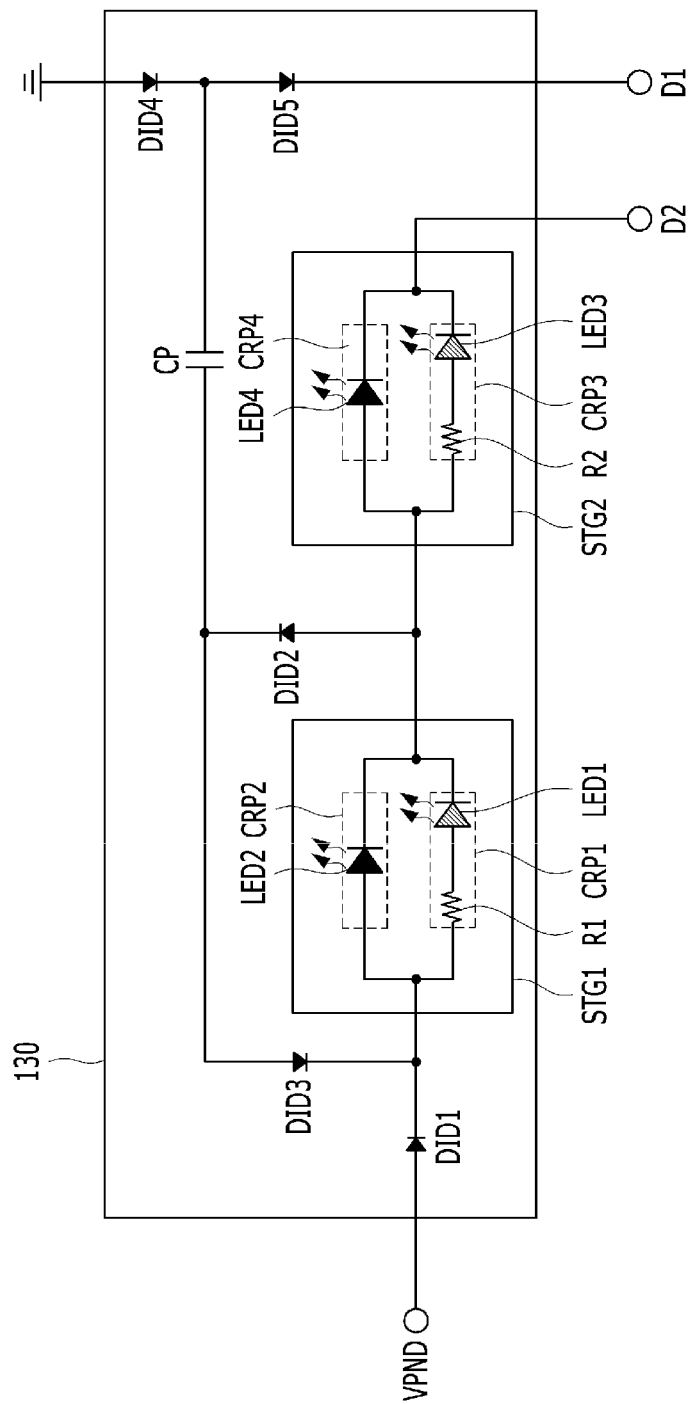
FIG. 7 is a circuit diagram of an LED circuit according to an exemplary embodiment.
Figure 8:
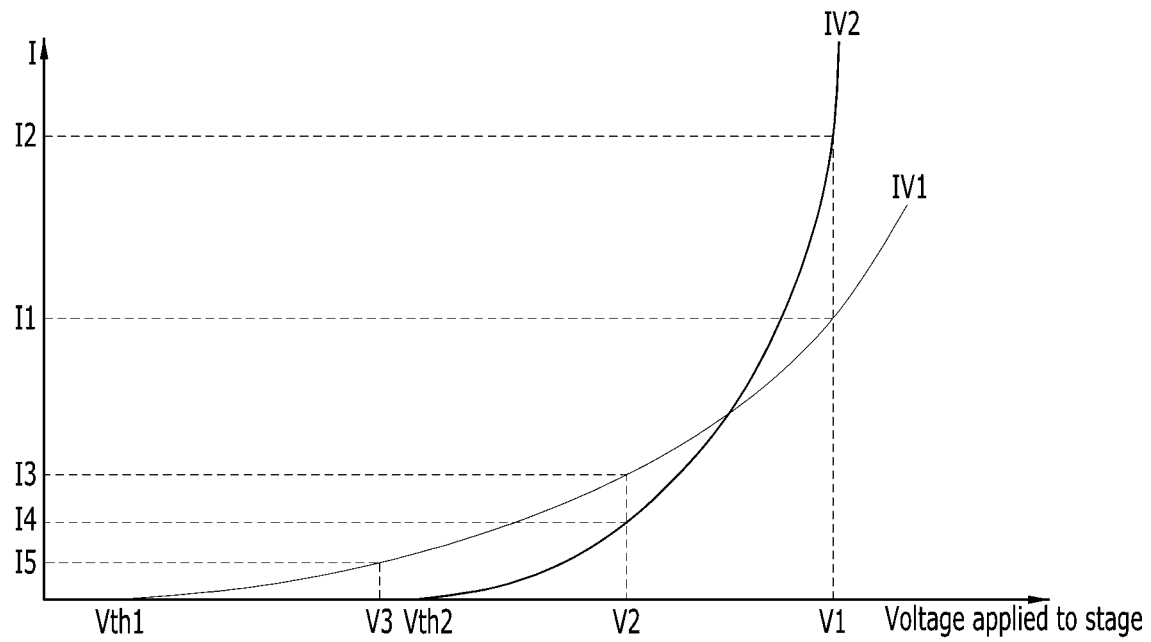
FIG. 8 is a graph for illustrating the relationship between a forward voltage and forward current for each of a first current path and a second current path.

FIG. 7 is a circuit diagram of the LED circuit 130 according to an exemplary embodiment. FIG. 8 is a graph illustrating the relationship between a forward voltage and forward current for each of a first current path CRP1 and a second current path CRP2.

Referring to FIG. 7, the first stage STG1 includes a first current path CRP1 and a second current path CRP2 which are connected in parallel, and the second stage STG2 includes a third current path CRP3 and a fourth current path CRP4 which are connected in parallel.

The first current path CRP1 of the first stage STG1 includes a first resistor R1 and a first LED LED1 which are connected in series. The second current path CRP2 of the first stage STG1 includes a second LED LED2. The first and second LEDs LED1 and LED2 may each emit light having different color temperatures. The mixed light of the first and second LEDs LED1 and LED2 is output from the first stage STG1. In an exemplary embodiment, the color temperature of the first LED LED1 may be lower than the color temperature of the second LED LED2.

The third current path CRP3 of the second stage STG2 includes a second resistor R2 and a third LED LED3 which are connected in series. The fourth current path CRP4 of the second stage STG2 includes a fourth LED LED4. The third LED LED3 may emit light having substantially the same color temperature as the first LED LED1. The fourth LED LED4 may emit light having substantially the same color temperature as the second LED LED2. In particular, the second stage STG2 may be have substantially the same configuration as the first stage STG1.

As such, hereinafter, currents flowing through the first current path CRP1 and the second current path CRP2 of the first stage STG1 will be mainly described.

A resistor connected in series to an LED may reduce the slope (or proportional constant) of forward current with respect to a forward voltage. For example, as the resistance of a resistor serially connected to an LED increases, the slope of forward current with respect to a forward voltage may be decreased. As such, the slope of forward current with respect to a forward voltage in the first current path CRP1 may be lower than that of the second current path CRP2.

As the same voltages are applied to both ends of the first and second current paths CRP1 and CRP2, and since the first and second current paths CRP1 and CRP2 are connected in parallel, when the first and second current paths CRP1 and CRP2 have different slopes as described above, the ratio of currents distributed to the first and second current paths CRP1 and CRP2 may be changed as the driving current changes.

Referring to FIG. 8, a first voltage-current curve IV1 is a graph showing the relationship between the forward voltage and the forward current of the first current path CRP1, and a second voltage-current curve IV2 is a graph showing the relationship between the forward voltage and the forward current of the second current path CRP2 according to an exemplary embodiment. When a voltage applied to the first stage STG1 is higher than a first threshold voltage Vth1, current flows through the first current path CRP1. For example, the first threshold voltage Vth1 may be considered as the threshold voltage of the first LED LED1, which is included in the first current path CRP1. When a voltage applied to the first stage STG1 is higher than a second threshold voltage Vth2, current flows through the second current path CRP2. For example, the second threshold voltage Vth2 may be considered as the threshold voltage of the second LED LED2, which is included in the second current path CRP2. The first threshold voltage Vth1 may be lower than the second threshold voltage Vth2. More particularly, the first and second LEDs LED1 and LED2 may be configured such that the first threshold voltage Vth1 is lower than the second threshold voltage Vth2.

Due to the resistor R1 connected in series to the first LED LED1, the first voltage-current curve IV1 may have a slope lower than the second voltage-current curve IV2. Accordingly, when driving current supplied to the first stage STG1 changes, the ratio of currents distributed to the first and second current paths CRP1 and CRP2 may be changed.

The first current I1 may flow through the first current path CRP1, as a relatively large amount of driving current is provided to the first stage STG1 by the driving current controller 150. As described above with reference to FIGS. 1 to 6, the driving current controller 150 adjusts driving current (see DI1 or DI2 of FIG. 1) depending on the dimming signal ADIM. According to the first voltage-current curve IV1, the voltage across the first current path CRP1 is a first voltage V1. Since the second current path CRP2 is connected in parallel to the first current path CRP1, the voltage across the second current path CRP2 is also the first voltage V1. According to the second voltage-current curve IV2, second current I2 may flow through the second current path CRP2. The second current I2 is higher than the first current I1.

The third current I3 lower than the first current I1 may flow through the first current path CRP1, as the driving current provided to the first stage STG1 decreases. According to the first voltage-current curve IV1, the voltage across the first current path CRP1 is a second voltage V2. Accordingly, the voltage across the second current path CRP2 is also the second voltage V2. According to the second voltage-current curve IV2, fourth current I4 may flow through the second current path CRP2. The fourth current I4 is lower than the third current I3.

The fifth current I5 lower than the third current I3 may flow through the first current path CRP1, as the driving current provided to the first stage STG1 further decreases. According to the first voltage-current curve IV1, the voltage across the first current path CRP1 is a third voltage V3. The third voltage V3 is lower than the second threshold voltage Vth2. Accordingly, current does not flow through the second current path CRP2, and therefore, the second current path CRP2 does not emit light. For example, the first threshold voltage Vth1 may be lower than the second threshold voltage Vth2 so as to provide a dimming level, which causes only the first current path CRP1 having a first color temperature to emit light and while the second current path CRP2 having a second color temperature does not emit light.

As such, as the driving current provided to the first stage STG1 decreases, the rate of current flowing through the first current path CRP1 may be increased, and the rate of current flowing through the second current path CRP2 may be decreased. When considering that the first LED LED1 and the second LED LED2 have different color temperatures, when the driving current provided to the first stage STG1 changes, the color temperature of the mixed light outputted from the first stage STG1 may be changed. Similarly, when the driving current provided to the second stage STG2 changes, the color temperature of the mixed light outputted from the second stage STG2 may be changed. Accordingly, in the lighting apparatus 100 according to an exemplary embodiment, adjusting the driving currents DI1 and DI2 provided to the stages STG1 and STG2 depending on a dimming level can adjust the color temperature of the mixed light outputted from the LED circuit 130.

In some exemplary embodiments, the color temperature of the first LED LED1 may be lower than the color temperature of the second LED LED2. In this case, as the driving current provided to the first stage STG1 decreases, the color temperature of the mixed light outputted from the first stage STG1 may be decreased. In particular, as a dimming level decreases, the color temperature of the mixed light output from the first stage STG1 may be decreased. As such, the lighting apparatus 100 may provide an effect similar to that in incandescent bulb, such as darkening an incandescent bulb decreases the color temperature of light emitted from a filament.

Figure 9:
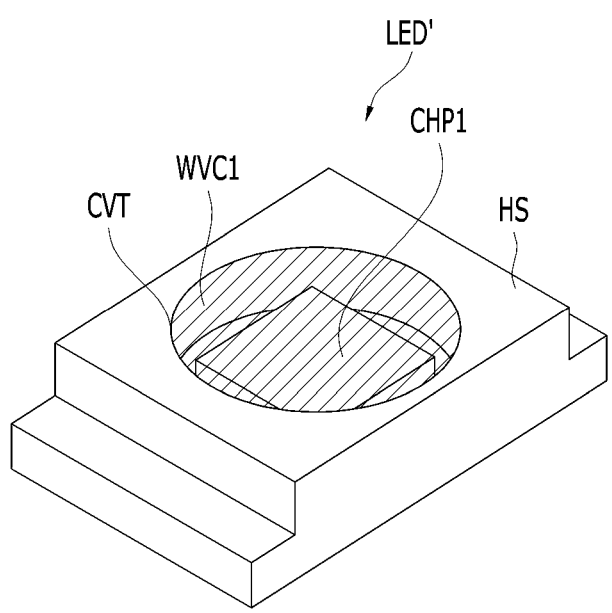
FIG. 9 is a perspective view of one of the first and third LEDs of FIG. 7 according to an exemplary embodiment.

FIG. 9 is a perspective view of one of the first and third LEDs LED1 and LED3 of FIG. 7 according to an exemplary embodiment.

Referring to FIG. 9, the LED LED' may include a housing HS, an LED chip CHP1 mounted in the housing HS, and a wavelength conversion layer WVC1 covering the LED chip CHP1.

The housing HS may be formed by injection-molding a plastic resin, for example. In this case, the housing HS may be formed to support lead terminals connected with the LED chip CHP1, by injection molding. The housing HS may have a cavity CVT, in which the LED chip CHP1 is mounted.

The LED chip CHP1 is disposed in the cavity CVT. The LED chip CHP1 may include a plurality of light-emitting cells. This will be described in detail later with reference to FIG. 10.

The wavelength conversion layer WVC1 covers the LED chip CHP1. In some exemplary embodiments, the wavelength conversion layer WVC1 may be formed by filling the cavity CVT with a molding resin including a fluorescent material after the LED chip CHP1 is mounted in the cavity CVT. In other exemplary embodiments, the LED chip CHP1 including a fluorescent material coating layer as the wavelength conversion layer WVC1 may be mounted in the housing HS. In this case, the LED chip CHP1 may be molded by a transparent resin.

In some exemplary embodiments, an optical member may be additionally disposed on the wavelength conversion layer WVC1.

The wavelength conversion layer WVC1 may convert the wavelength of light emitted from the LED chip CHP1 to generate white light. The color temperature of light output from the LED LED' may be determined by the wavelength conversion layer WVC1.

The plurality of light-emitting cells in the LED chip CHP1 may share the one wavelength conversion layer WVC1. In this manner, a processing error from forming separate wavelength conversion layers for each light emitting cell may be avoided, such that light of a desired color temperature may be emitted from the LED chip CHP1. Accordingly, the LED circuit 130 according to an exemplary embodiment may be capable of precisely adjusting a color temperature to a target color temperature depending on a dimming level.

Figure 10:
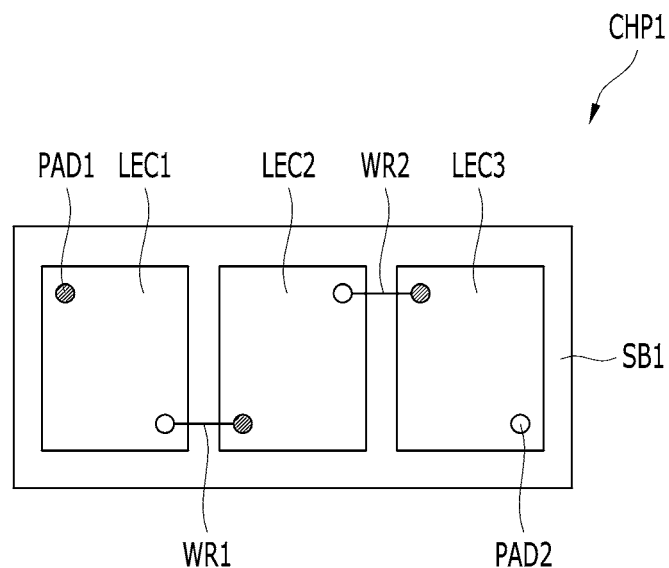
FIG. 10 is a top view of the LED chip of FIG. 9 according to an exemplary embodiment.

FIG. 10 is a top view of the LED chip CHP1 of FIG. 9 according to an exemplary embodiment.

Referring to FIG. 10, the LED chip CHP1 may include a substrate SB1, a plurality of light-emitting cells LEC1 to LEC3 disposed on the substrate SB1, wires WR1 and WR2, and two pads PAD1 and PAD2 for connecting the light-emitting cells LEC1 to LEC3 to an external component, such as lead terminals. Each of the light-emitting cells LEC1 to LEC3 may include gallium nitride-based material and emit ultraviolet or blue light. The plurality of light-emitting cells LEC1 to LEC3 may be connected in series by the wires WR1 and WR2. In some exemplary embodiments, the wires WR1 and WR2 may be replaced with various components capable of electrically connecting the plurality of light-emitting cells LEC1 to LEC3. For example, the LED chip CHP1 may include conductive layers, which may be formed through deposition and patterning, and the plurality of light-emitting cells LEC1 to LEC3 may be electrically connected to each other through the conductive layers.

The threshold voltages of the respective light-emitting cells LEC1 to LEC3 may be substantially the same. In this case, as the number of serially connected light-emitting cells LEC1 to LEC3 in the LED chip CHP1 increases, the threshold voltage of the LED chip CHP1 may be increased. FIG. 10 exemplarily illustrates that the LED chip CHP1 includes three light-emitting cells LEC1 to LEC3. However, the inventive concepts are not limited to a particular number of light-emitting cells in the LED chip CHP1.

Figure 11:
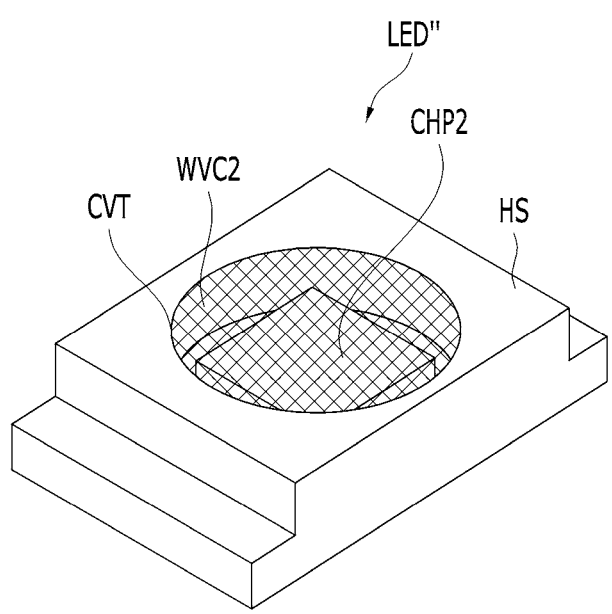
FIG. 11 is a perspective view of one of the second and fourth LEDs of FIG. 7 according to an exemplary embodiment.

FIG. 11 is a perspective view of one of the second and fourth LEDs LED2 and LED4 of FIG. 7 according to an exemplary embodiment.

Referring to FIG. 11, the LED LED" may include a housing HS, an LED chip CHP2 mounted in the housing HS, and a wavelength conversion layer WVC2 covering the LED chip CHP2.

The LED chip CHP2 may be disposed in a cavity CVT of the housing HS. The LED chip CHP2 includes a plurality of light-emitting cells. The LED chip CHP2 may include a larger number of light-emitting cells than the LED chip CHP1 of FIG. 9. This will be described in detail later with reference to FIG. 12.

The wavelength conversion layer WVC2 may convert the wavelength of light emitted from the LED chip CHP2 to generate white light. The color temperature of the white light converted by the wavelength conversion layer WVC2 may be higher than that of the wavelength conversion layer WVC1 of FIG. 9. Materials, such as a fluorescent material, of the wavelength conversion layer WVC2 may be appropriately selected to have a desired color temperature. The wavelength conversion layer WVC2 may cover the plurality of light-emitting cells in common, to reduce or avoid a processing error described above and to emit light of a desired color temperature. Accordingly, the LED circuit 130 may be capable of precisely adjusting a color temperature to a target color temperature depending on a dimming level.

Figure 12:
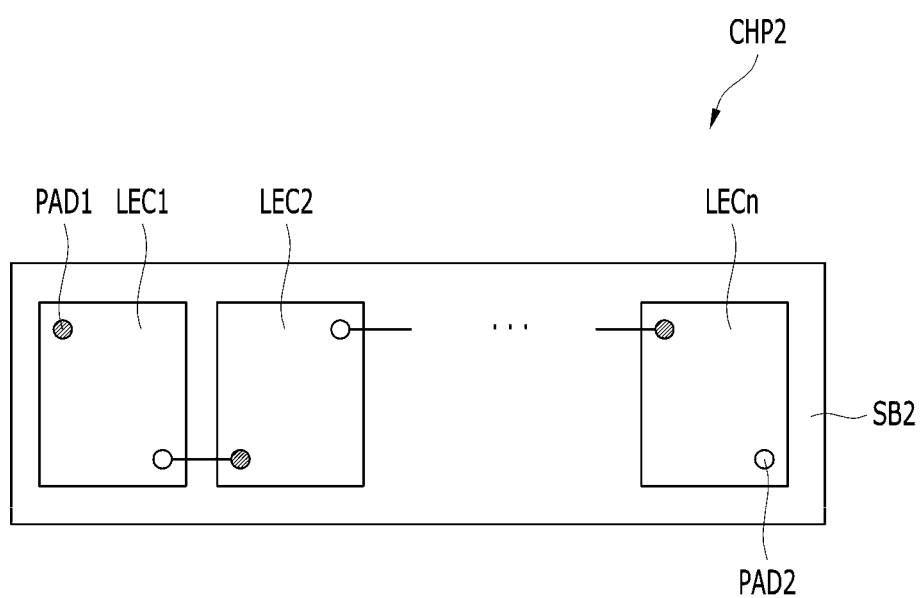
FIG. 12 is a top view of the LED chip of FIG. 11 according to an exemplary embodiment.

FIG. 12 is a top view of the LED chip CHP2 of FIG. 11 according to an exemplary embodiment.

Referring to FIG. 12, the LED chip CHP2 may include a substrate SB2, a plurality of light-emitting cells LEC1 to LECn (n is an integer greater than 3) disposed on the substrate SB2, wires for connecting the plurality of light-emitting cells LEC1 to LECn one to another, and two pads PAD1 and PAD2 for connecting the plurality of light-emitting cells LEC1 to LECn to an external component. The plurality of light-emitting cells LEC1 to LECn may be connected in series through the wires. In some exemplary embodiments, the wires may be replaced with various components capable of electrically connecting the plurality of light-emitting cells LEC1 to LECn.

The number of the light-emitting cells LEC1 to LECn included in the LED chip CHP2 may be greater than the number of the light-emitting cells LEC1 to LEC3 of the LED chip CHP1 of FIG. 10. As such, the threshold voltage (see Vth2 of FIG. 8) of the LED chip CHP2 may be higher than the threshold voltage (see Vth1 of FIG. 8) of the LED chip CHP1 of FIG. 10.

According to an exemplary embodiment, each LED may include an LED chip having a plurality of light-emitting cells therein and a wavelength conversion layer covering the light-emitting cells in common, and accordingly, may have a reduced processing error and emit light of a desired color temperature. Accordingly, it is possible to provide the LED circuit 130 capable of precisely adjusting a color temperature to a target color temperature depending on a dimming level. Moreover, by adjusting the number of light-emitting cells included in the LED, the threshold voltage of the LED may be efficiently adjusted.

Figure 13:
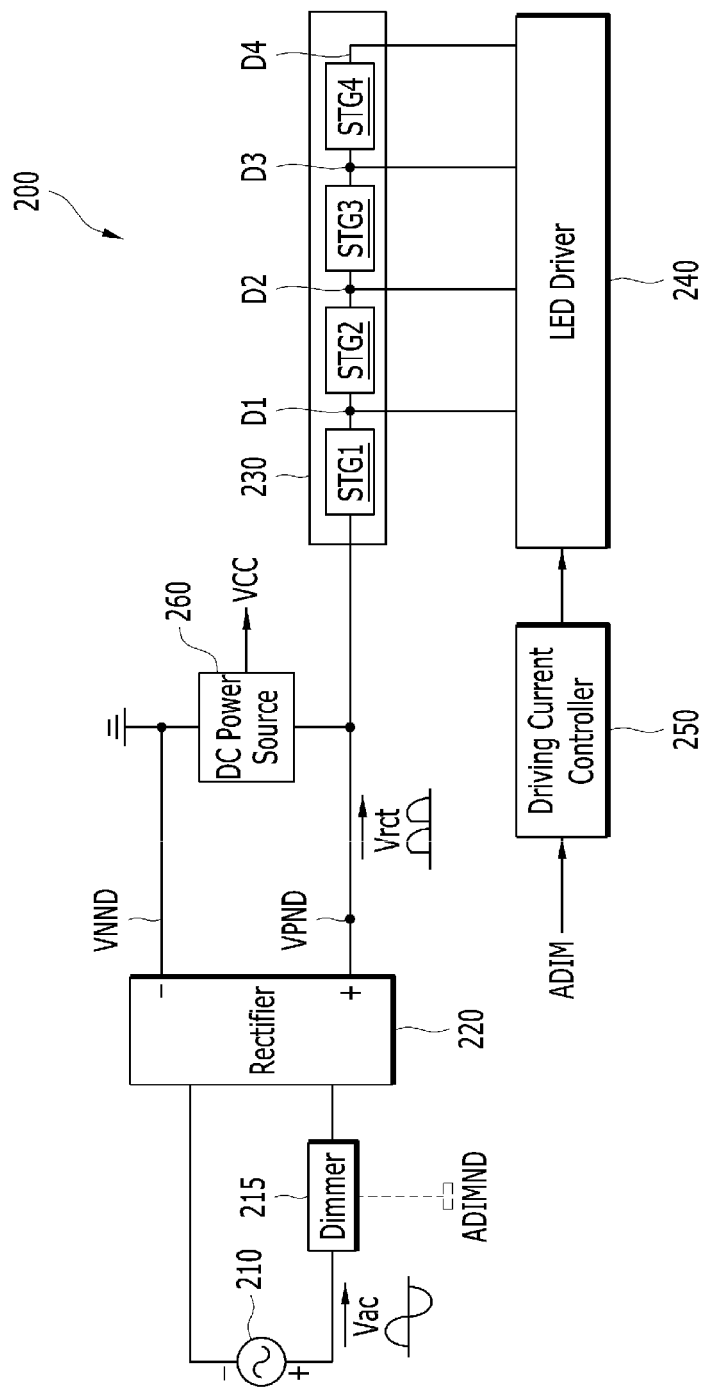
FIG. 13 is a block diagram of a lighting apparatus according to another exemplary embodiment.

FIG. 13 is a block diagram of a lighting apparatus 200 according to another exemplary embodiment.

Referring to FIG. 13, the lighting apparatus 200 may be connected to an AC power source 210 and receive an AC voltage Vac, and may include a dimmer 215, a rectifier 220, an LED circuit 230, an LED driver 240, a driving current controller 250, and a DC power source 260.

The dimmer 215, the rectifier 220, the driving current controller 250, and the DC power source 260 are substantially the same as the dimmer 115, the rectifier 120, the driving current controller 150, and the DC power source 160 described above with reference to FIG. 1. As such, repeated descriptions of the substantially the same elements will be omitted to avoid redundancy.

The LED circuit of the inventive concepts may be variously modified. For example, the LED circuit 230 according to the illustrated exemplary embodiment may include a plurality of stages STG1 to STG4, which are configured to selectively emit light in response to the level of a rectified voltage Vrct. In some exemplary embodiments, the number of the plurality of stages STG1 to STG4, the connection relationship among the plurality of stages STG1 to STG4, and the connection relationship between the plurality of stages STG1 to STG4 and the LED driver 240 may be changed variously.

In FIG. 13, the LED circuit 230 is shown as including four stages STG1 to STG4. The first to fourth stages STG1 to STG4 may be sequentially connected through first to fourth driving nodes D1 to D4, and may be connected to the LED driver 240 through the first to fourth driving nodes D1 to D4. Each stage may be configured in substantially the same manner as the stage described above with reference to FIG. 7.

The LED driver 240 may be connected to the LED circuit 230 through the first to fourth driving nodes D1 to D4, and may control the driving currents of the first to fourth driving nodes D1 to D4 under the control of the driving current controller 250.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A lighting apparatus comprising:
    an LED circuit including a plurality of serially connected stages configured to receive a modulated rectified voltage, each of the stages comprising:
        a first path including a first resistor and a first LED connected in series; and
        a second path connected to the first path in parallel and including a second LED configured to emit light having a color temperature different from that emitted from the first LED; and
    a driving current controller configured to adjust an intensity of light output from the LED circuit by adjusting currents applied to driving nodes connected to the stages, depending on a dimming signal associated with a dimming level of the rectified voltage,
    wherein a threshold voltage of the first LED is lower than that of the second LED.

2. The lighting apparatus according to claim 1, wherein:
    the first LED includes first light-emitting cells and a first wavelength conversion layer covering the first light-emitting cells; and
    the second LED includes second light-emitting cells and a second wavelength conversion layer different from the first wavelength conversion layer.

3. The lighting apparatus according to claim 2, wherein:
    the first light-emitting cells are connected with each other in series;
    the second light-emitting cells are connected with each other in series; and
    the number of the first light-emitting cells is less than the number of the second light-emitting cells.

4. The lighting apparatus according to claim 1, wherein the first LED is configured to emit light having a first color temperature, and the second LED is configured to emit light having a second color temperature lower than the first color temperature.

5. The lighting apparatus according to claim 1, wherein:
    the stages include a first stage and a second stage sequentially connected to each other;
    the driving nodes include a first driving node;
    the first stage is connected between an input node configured to receive the rectified voltage and a branch node, and the second stage is connected between the branch node and the first driving node; and
    the driving current controller is configured to control a current of the first driving node depending on the dimming signal.

6. The lighting apparatus according to claim 5, wherein:
the driving nodes further include a second driving node;
the LED circuit further includes a capacitor connected between the branch node and the second driving node; and
the driving current controller is configured to control a current of the second driving node depending on the dimming signal.

7. The lighting apparatus according to claim 1, wherein:
the stages include sequentially connected first, second, third, and fourth stages, and the driving nodes include first, second, third, and fourth driving nodes;
the first stage is connected between an input node configured to receive the rectified voltage and the first driving node, the second stage is connected between the first and second driving nodes, the third stage is connected between the second and third driving nodes, and the fourth stage is connected between the third and fourth driving nodes; and
the driving current controller is configured to control currents of the first, second, third, and fourth driving nodes depending on the dimming signal.

8. The lighting apparatus according to claim 1, further comprising an LED driver connected to the LED circuit and the driving current controller through the driving nodes and a current setting node, respectively,
wherein:
the LED driver is configured to adjust currents of the driving nodes depending on a voltage of the current setting node; and
the driving current controller is configured to control the voltage of the current setting node depending on the dimming signal.

9. The lighting apparatus according to claim 1, further comprising a dimmer configured to generate the dimming signal.

10. The lighting apparatus according to claim 9, wherein the dimmer comprises at least one of a triac dimmer and a pulse-width dimmer.

11. A lighting apparatus comprising:
an LED circuit including a plurality of serially connected stages configured to receive a modulated rectified voltage, each of the stages comprising:
a first path including a first resistor and a first LED connected in series; and
a second path connected to the first path in parallel and including a second LED configured to emit light having a color temperature different from that emitted from the first LED; and
a driving current controller configured to adjust an intensity of light output from the LED circuit in accordance with a dimming signal by adjusting currents applied to the stages,
wherein the second LED has a greater number of light emitting cells than the first LED.

12. The lighting apparatus according to claim 11, wherein the color temperature of light emitted from the first LED is lower than that of light emitted from the second LED.

13. The lighting apparatus according to claim 11, wherein the threshold voltage of the light emitting cells of the first and second LEDs are the same as each other.

14. The lighting apparatus according to claim 13, wherein the light emitting cells of each of the first and second LEDs are serially connected to one another and are covered by a wavelength conversion layer.

15. The lighting apparatus according to claim 11, further comprising an LED driver connected between the LED circuit and the driving current controller, the LED driver including comparators connected to the stages, respectively.

16. The lighting apparatus according to claim 15, wherein the LED circuit further includes a capacitor connected to an output terminal of one of the stages and one of the comparators, the capacitor being configured to be charged and discharged in accordance to a level of the rectified voltage, and provide current to the stages while being discharged.

17. The lighting apparatus according to claim 15, wherein the comparators are connected in common to the driving current controller.

18. The lighting apparatus according to claim 11, further comprising a driving current control circuit connected to the driving current controller and configured to provide a DC voltage control signal to the driving current controller.

19. The lighting apparatus according to claim 11, wherein a threshold voltage of the first LED is lower than that of the second LED.

20. The lighting apparatus according to claim 11, further comprising a triac dimmer configured to generate the dimming signal.

* * * * *